(12) United States Patent
Drewes

(10) Patent No.: US 6,683,806 B2
(45) Date of Patent: Jan. 27, 2004

(54) METHODS OF OPERATING MRAM DEVICES

(75) Inventor: Joel A. Drewes, Boise, ID (US)

(73) Assignee: Micron Technology, Inc., Boise, ID (US)

(*) Notice: Subject to any disclaimer, the term of this patent is extended or adjusted under 35 U.S.C. 154(b) by 40 days.

(21) Appl. No.: 10/107,605

(22) Filed: Mar. 26, 2002

(65) Prior Publication Data

US 2003/0185045 A1 Oct. 2, 2003

(51) Int. Cl.[7] .............................................. G11C 11/00
(52) U.S. Cl. ........................ 365/158; 365/171; 365/173
(58) Field of Search ................................. 365/158, 171, 365/173

(56) References Cited

U.S. PATENT DOCUMENTS 6,111,783 A * 8/2000 Tran et al. ................... 365/171
6,522,578 B2 * 2/2003 Poechmueller ............... 365/171
6,538,917 B1 * 3/2003 Tran et al. .................... 365/158

* cited by examiner

Primary Examiner—Michael S. Lebentritt
Assistant Examiner—Pho Luu
(74) Attorney, Agent, or Firm—Wells St. John P.S.

(57) ABSTRACT

An MRAM construction can include an MRAM device between a pair of substantially orthogonal conductive lines, with one of the substantially orthogonal conductive lines being configured to induce $H_x$ within the device, and the other being configured to induce $H_y$ within the device. A first pulse of current is passed along a first of the two conductive lines while passing at least two sequential pulses of current along a second of the two conductive lines. The sequential pulses include a pulse along a first direction of the second of the two conductive lines, and a pulse along a second direction opposite to the first direction.

56 Claims, 5 Drawing Sheets

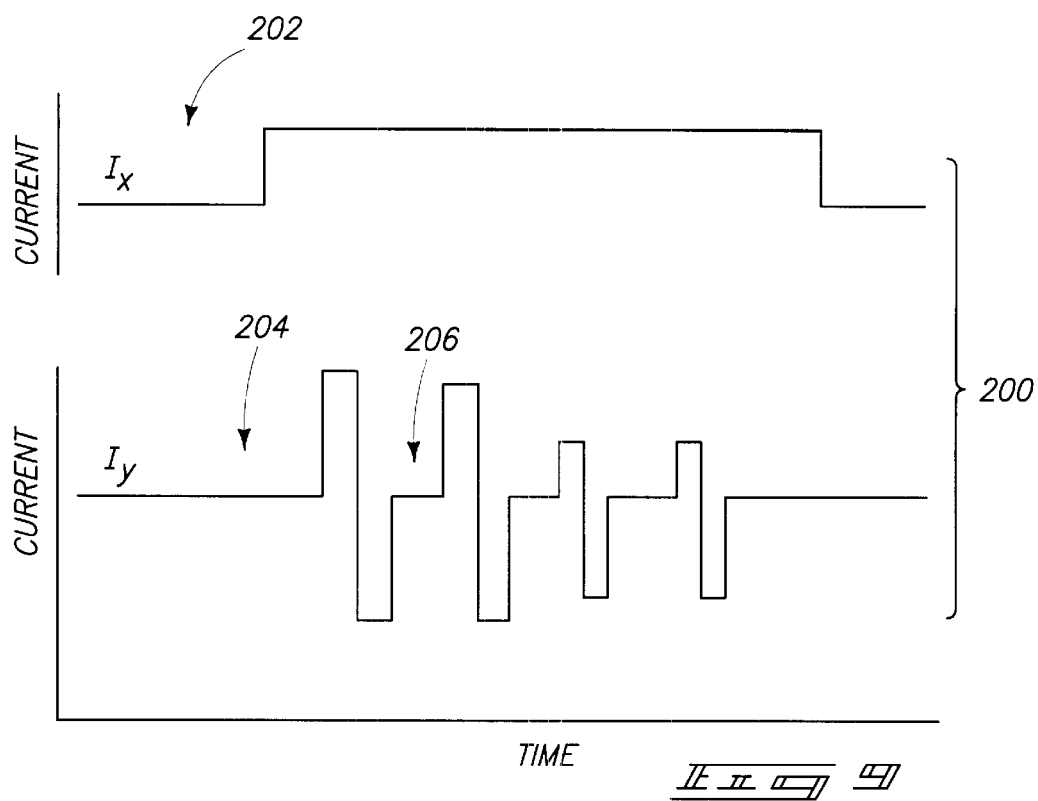
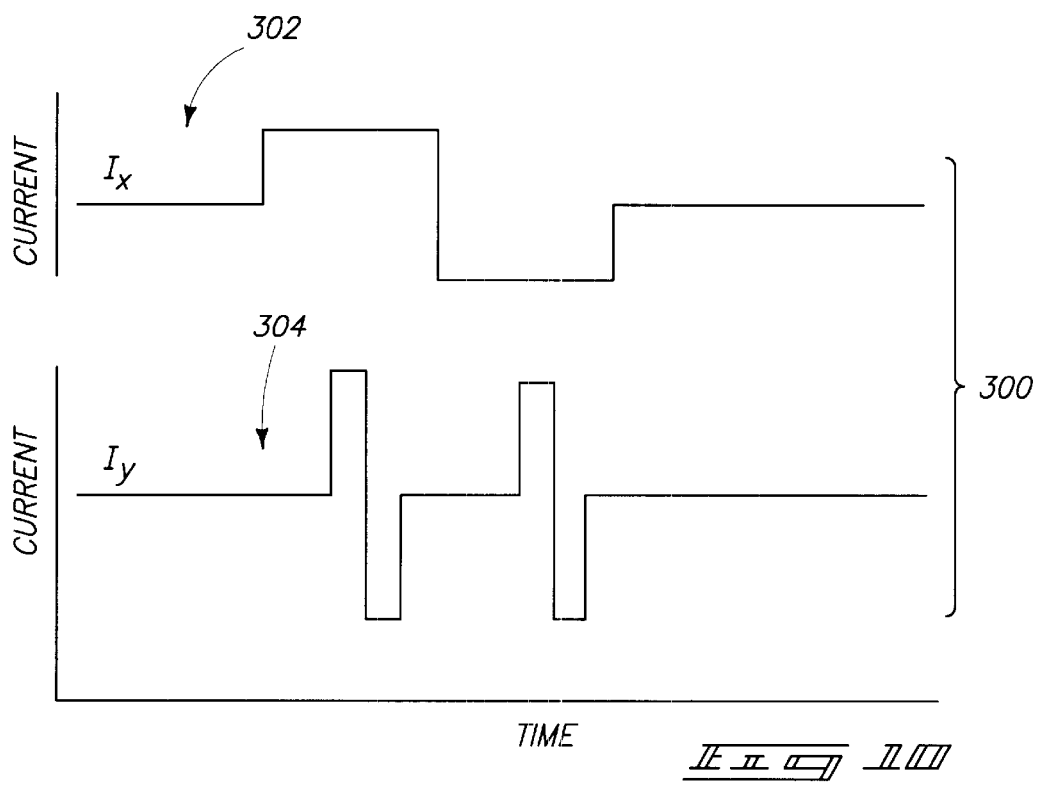

6,683,806 B2

METHODS OF OPERATING MRAM DEVICES

TECHNICAL FIELD

The invention pertains to methods of operating magnetic random access memory (MRAM) devices, and to methods of operating constructions incorporating MRAM devices. In particular aspects, the invention pertains to methods for operating half-select MRAM assemblies.

BACKGROUND OF THE INVENTION

MRAM devices are showing increasing promise for utilization as memory storage devices of the future. MRAM is a type of digital memory in which digital bits of information comprise alternative states of magnetization of magnetic materials in memory cells. The magnetic materials can be thin ferromagnetic films. Information can be stored and retrieved from the memory devices by inductive sensing to determine a magnetization state of the devices, or by magnetoresistive sensing of the magnetization states of the devices.

A significant amount of research is currently being invested in magnetic digital memories, such as, for example, MRAM's, because such memories are seen to have significant potential advantages relative to the dynamic random access memory (DRAM) components and static random access memory (SRAM) components that are presently in widespread use. For instance, a problem with DRAM is that it relies on electric charge storage within capacitors. Such capacitors leak electric charge, and must be refreshed at approximately 64–128 millisecond intervals. The constant refreshing of DRAM devices can drain energy from batteries utilized to power the devices, and can lead to problems with lost data since information stored in the DRAM devices is lost when power to the devices is shut down.

SRAM devices can avoid some of the problems associated with DRAM devices, in that SRAM devices do not require constant refreshing. Further, SRAM devices are typically faster than DRAM devices. However, SRAM devices take up more semiconductor real estate than do DRAM devices. As continuing efforts are made to increase the density of memory devices, semiconductor real estate becomes increasingly valuable. Accordingly, SRAM technologies are difficult to incorporate as standard memory devices in memory arrays.

MRAM devices have the potential to alleviate the problems associated with DRAM devices and SRAM devices. Specifically, an MRAM device does not require constant refreshing, but instead stores data in stable magnetic states. Further, the data stored in MRAM devices will remain within the devices even if power to the devices is shutdown or lost. Additionally, MRAM devices can potentially be formed to utilize less than or equal to the amount of semiconductor real estate associated with DRAM devices, and can accordingly potentially be more economical to incorporate into large memory arrays than are SRAM devices.

Although MRAM devices have potential to be utilized as digital memory devices, they are currently not widely utilized. Several problems associated with MRAM technologies remain to be addressed. It would be desirable to develop improved methods for operation of MRAM devices.

FIG. 1 illustrates a fragment of an exemplary prior art construction 10 comprising an MRAM device 12. More specifically, construction 10 comprises a substrate 14 having a conductive line 16 formed thereover, and device 12 is formed over the conductive line.

Substrate 14 can comprise an insulative material, such as, for example, borophosphosilicate glass (BPSG), silicon dioxide and/or silicon nitride. Such insulative material can be formed over a semiconductive material, such as, for example, monocrystalline silicon. Further, various integrated circuit devices can be supported by the semiconductive material. In the construction of FIG. 1, substrate 14 is illustrated generically as a homogeneous mass, but it is to be understood from the discussion above that substrate 14 can comprise numerous materials and layers. In the event that substrate 14 comprises a semiconductive material, such semiconductive material can be, for example, monocrystalline silicon lightly-doped with a background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Conductive line 16 can comprise, for example, various metals and metal alloys, such as, for example, copper and/or aluminum.

The MRAM device 12 formed over line 16 comprises three primary layers, 18, 20 and 22. Layers 18 and 22 comprise soft magnetic materials, such as, for example, materials comprising one or more of nickel, iron, cobalt, iridium, manganese, platinum and ruthenium. Layer 20 comprises a non-magnetic material. The non-magnetic material can be an electrically conductive material (such as copper) in applications in which the MRAM is to be a giant magnetoresistive (GMR) device, or can be an electrically insulative material (such as, for example, aluminum oxide ($Al_2O_3$) or silicon dioxide), in applications in which the MRAM device is to be a tunnel magnetoresistive (TMR) device.

Layers 18 and 22 have magnetic moments associated therewith. The magnetic moment in layer 18 is illustrated by arrows 19, and the magnetic moment in layer 22 is illustrated by arrows 21. In the shown construction, the magnetic moment in layer 22 is anti-parallel to the magnetic moment in layer 18. Such is one of two stable orientations for the magnetic moment of layer 22 relative to that of 18, with the other stable orientation being a parallel orientation of the magnetic moment in layer 22 relative to the moment in layer 18. One of layers 18 and 22 can have a pinned orientation of the magnetic moment therein, and such can be accomplished by providing a hard magnetic layer, or in other words a permanent magnet (not shown) adjacent the layer. The layer having the pinned magnetic moment can be referred to as a reference layer.

In operation, MRAM device 12 can store information as a relative orientation of the magnetic moment in layer 22 to that in layer 18. Specifically, either the anti-parallel or parallel orientation of the magnetic moments of layers 18 and 22 can be designated as a 0, and the other of the anti-parallel and parallel orientations can be designated as a 1. Accordingly, a data bit can be stored within device 12 as the relative orientation of magnetic moments in layers 18 and 22.

A conductive line 24 is shown over layer 22, and such conductive line extends into and out of the plane of the page. Conductive line 24 can comprise, for example, one or more metals and/or metal alloys, including, for example, copper and/or aluminum.

An insulative material 26 extends over conductive line 16, and along the sides of bit 12 and conductive line 24. Insulative material 26 can comprise, for example, BPSG.

The construction 10 is an exemplary MRAM construction, and it is to be understood that various modifications can be made to the construction 10 for various applications. For instance, one or more electrically insulative layers (not shown) can be provided between device 12 and one or both of conductive lines 16 and 24. Also, one or more magnetic layers (not shown) can be stacked within device 12 in addition to the shown layers 18 and 22.

In operation, data is written to MRAM device 12 by passing current along the conductive lines 16 and 24 to change the relative magnetic orientation of layers 18 and 22 (i.e., to flip the relative orientation from parallel to anti-parallel, or vice versa). In theory, the relative orientation of layers 18 and 22 can be flipped by passing sufficient current along only one of lines 16 and 24, but in practice it is generally found to be advantageous to utilize both of lines 16 and 24 in writing information to device 12. Specifically, some current is initially passed along one of the lines 16 and 24 to induce a magnetic field in device 12 which starts to flip the relative magnetic orientation of layers 18 and 22, and then current is passed along the other of layers 16 and 24 to complete the flip of the relative magnetic orientation within device 12.

The operation of reading information from device 12 can utilize either inductive sensing or magnetoresistive sensing to detect the relative magnetic orientation of layers 18 and 22 within the device. The reading can utilize one or both of lines 16 and 24, and/or can utilize a separate conductive line (not shown).

It is advantageous to have lines 16 and 24 be orthogonal to one another at the location of device 12 to maximize the complementary effect of utilizing both of conductive lines 16 and 24. A device which utilizes a pair of independently controlled conductive lines for writing to and/or reading from an MRAM device is typically referred to as a half-select MRAM construction. Typically, one of the orthogonal lines 16 and 24 will be designated as inducing field $H_x$ parallel to the moments of layers 22 and 18 (with layer 24 inducing $H_x$ in the shown embodiment), and the other will be designated as inducing field $H_y$ perpendicular to the moments of layers 22 and 18 (with layer 16 inducing $H_y$ in the shown embodiment). Accordingly, layers 16 and 24 induce orthogonal magnetic fields within MRAM device 12.

As discussed above, a single MRAM device can store a single bit of information. Accordingly, in applications in which it is desired to process multiple bits of information, it is generally desired to utilize a plurality of MRAM devices, with each of the devices independently storing bits of information. The devices will typically be arranged in an array, and an exemplary array 50 of MRAM devices is illustrated in FIG. 2. The array comprises individual MRAM devices 52, 54, 56, 58, 60 and 62. The array also comprises a plurality of conductive lines 64, 66 and 68 utilized for inducing $H_x$, and a plurality of conductive lines 70 and 72 utilized for inducing $H_y$.

In operation, information is written to an individual MRAM device by passing current through the lines that intersect at the device to simultaneously induce $H_x$ and $H_y$ within the device. For instance, information can be written to device 52 by passing current simultaneously along lines 68 and 70. Preferably, the current passed along either of lines 68 and 70 will be insufficient to change a memory state of an MRAM device by itself, and accordingly the memory states of devices 54, 56 and 60 will be unaffected during the writing of information to device 52.

FIG. 3 illustrates a diagram 80 showing typical current pulses which will be passed along lines 68 and 70 during an operation of writing information to an MRAM device. The current utilized to induce $H_x$ is labeled as $I_x$, and the current utilized to induce $H_y$ is labeled as $I_y$.

Diagram 80 comprises a pair of overlaid graphs 82 and 84 illustrating current flow along $I_x$ and $I_y$, respectively, as a function of time. The peak amount of current passed along $I_x$ and $I_y$ will typically be from about 0.2 milliamp to about 100 milliamps, and will typically induce a magnetic field within an MRAM device (for example device 12 of FIG. 1), of from about 10 Oersteds to about 200 Oersteds. It is noted that the current flow along $I_x$ is increased prior to an increase of current along $I_y$, but in alternative applications the current along $I_y$ can be increased (sometimes referred to as being turned "on") prior to the current along $I_x$. In the shown application, there is a window of time where current flows along both $I_x$ and $I_y$ simultaneously, followed by a window of time where current continues along $I_x$ after the current along $I_y$ has been reduced to a base level. The reason for the additional current along $I_x$ after reducing the current along $I_y$ to a base level is to insure that a memory state of an MRAM device has been fully flipped to a stable configuration (i.e., fully flipped from an anti-parallel orientation to a parallel orientation, or vice versa) prior to reducing the current along $I_x$ to its initial base level.

A difficulty that can be encountered is that the various MRAM devices of an array can differ from one another in the amount of magnetic field required to induce a change in magnetic orientation within the devices. Specifically, it is found that some devices flip from one magnetic orientation to another at relatively low levels of induced magnetic field, whereas other devices require relatively high levels of induced magnetic field to cause a change in magnet orientation. If the $I_x$ and $I_y$ currents are chosen to be sufficiently high to change the memory states of the hard-to-flip memory devices, it is found that the easy-to-flip devices can change memory state due to the influence of either the induced $H_x$ or the induced $H_y$ alone. On the other hand, if $I_x$ and $I_y$ are kept small enough to avoid inadvertently switching the memory state of the easy-to-flip devices when acting alone, it is found that the combination of the $H_x$ and $H_y$ induced magnetic fields can be too small to flip the memory states of the hard-to-flip memory devices. It would therefore be desirable to develop new methods for transferring information to and from MRAM devices.

SUMMARY OF THE INVENTION

In one aspect, the invention encompasses a method of operating a half-select MRAM construction which comprises sequentially inducing two opposing orientations of $H_y$ within an MRAM device while inducing $H_x$ within the device.

In another aspect, the invention encompasses a method of operating an MRAM construction. The MRAM construction includes an MRAM device between a pair of substantially orthogonal conductive lines, with one of the substantially orthogonal conductive lines being configured to induce $H_x$ within the device, and the other being configured to induce $H_y$ within the device. The method comprises passing a first pulse of current along a first of the two conductive lines while passing at least two sequential pulses of current along a second of the two conductive lines. The at least two sequential pulses include a pulse along a first direction of the second of the two conductive lines, and a pulse along a second direction opposite to the first direction.

In another aspect, the invention encompasses a method of operating an MRAM device. Current is flowed in a defined forward direction along the first axis relative to the device to induce a first magnetic field within the device. While the first magnetic field is within the device, current is flowed along a second axis relative to the device to induce a second magnetic field within the device. The second axis is different than the first axis. While the second magnetic field is within the device, the current flow along the first axis is reversed to a defined reverse direction and induces a third magnetic field within the device.

BRIEF DESCRIPTION OF THE DRAWINGS

Preferred embodiments of the invention are described below with reference to the following accompanying drawings.

FIG. 4 illustrates a left diagram showing $H_y$ extending perpendicularly to $H_x$, and a magnetic moment aligned along $H_x$. FIG. 4 also shows a right diagram illustrating a detected amplitude of a property associated with the moment relative to an applied field along $H_y$ during a constant applied field along $H_x$.

FIG. 9 illustrates a graph of current versus time along $I_x$, stacked over a graph of current versus time along $I_y$, and shows a pattern of current pulses which can be utilized in a particular aspect of the present invention.

FIG. 10 illustrates a graph of current versus time along $I_x$, stacked over a graph of current versus time along $I_y$, and shows a pattern of current pulses which can be utilized in a particular aspect of the present invention.

DETAILED DESCRIPTION OF THE PREFERRED EMBODIMENTS

One aspect of the invention is a consideration of why various MRAM devices in an array will require different levels of magnetic field inducement to flip a magnetic orientation. A mechanism which can explain the differences between MRAM devices in an array is described with reference to FIGS. 4 and 5.

Figure 4:
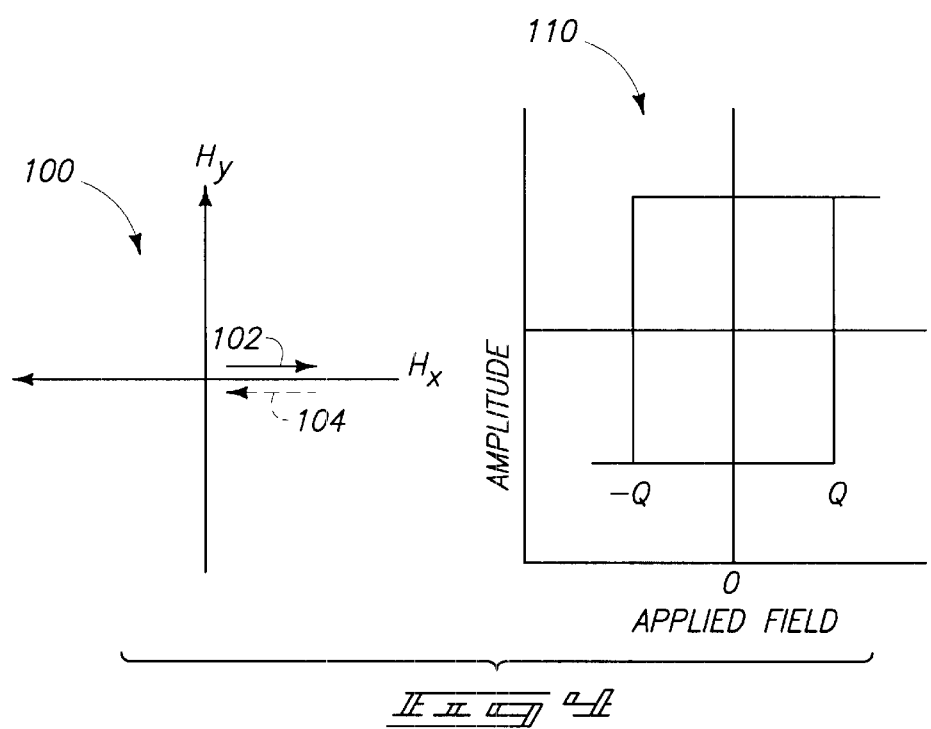
FIG. 4 illustrates a pair of graphs utilized in describing the influence of a magnetic moment orientation on the symmetry of an induced flip in the moment.

Referring initially to FIG. 4, a diagram 100 schematically illustrates an MRAM construction in which a magnetic field $H_x$ extends along a first direction, and a magnetic field $H_y$ extends along a second direction which is substantially orthogonal to the first direction. The second direction is referred to as being "substantially" orthogonal to the first direction to indicate that even though the second direction may not be strictly orthogonal in a mathematical sense, the second direction is orthogonal to the first direction within the practical limits of fabricating a construction having magnetic components $H_x$ and $H_y$. A magnetic moment 102 of an MRAM device is shown superimposed on the diagram of $H_x$ and $H_y$, and an opposite magnetic moment 104 is shown in dashed line.

Figure 1:
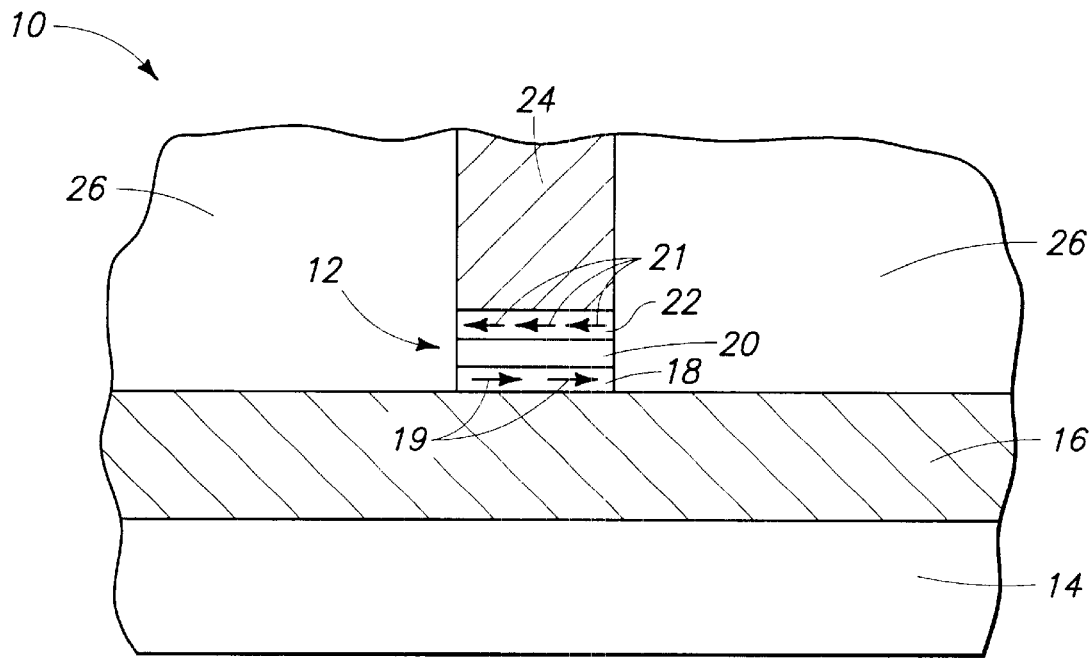
FIG. 1 is a diagrammatic, cross-sectional view of a fragment illustrating a prior art MRAM construction.
Figure 2:
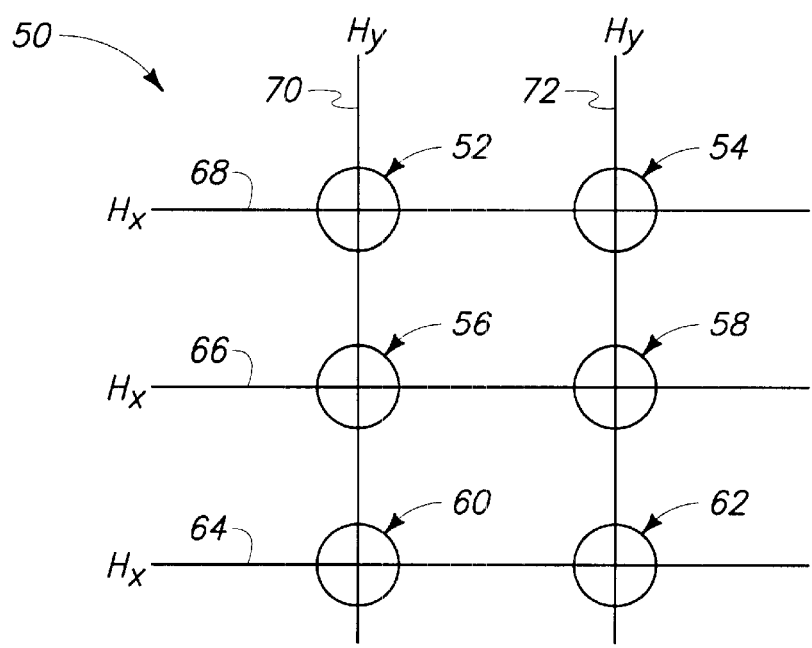
FIG. 2 is a diagrammatic illustration of a prior art memory array comprising MRAM devices.
Figure 3:
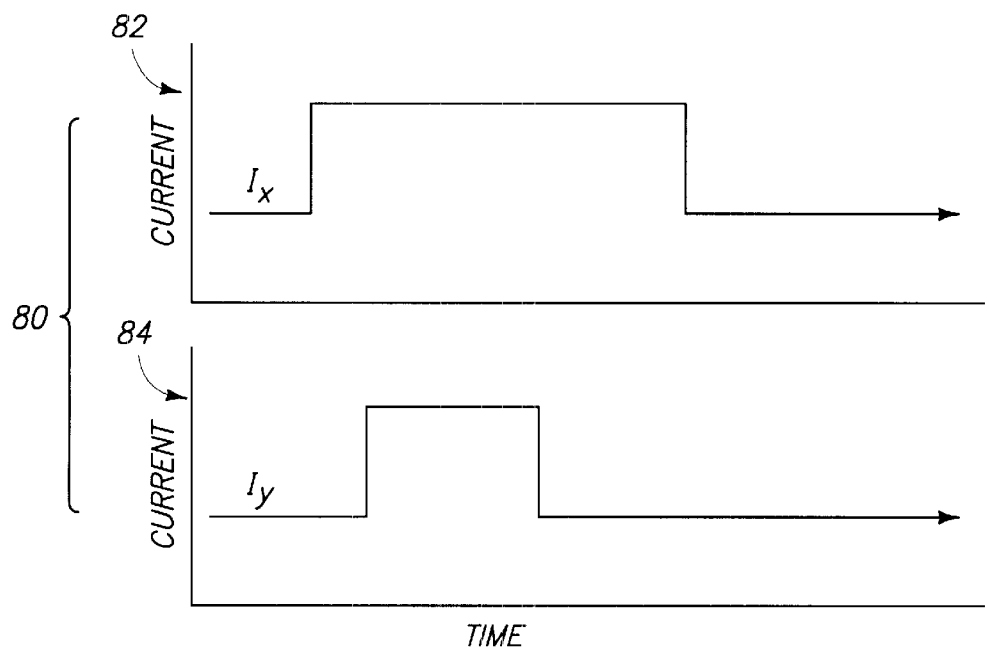
FIG. 3 is a diagrammatic illustration of a pair of graphs of current versus time illustrating prior art current pulses along directions $I_x$ and $I_y$ which are utilized to induce changes of magnetic orientation in an MRAM device.

The magnetic moment 102 corresponds to a stable moment within one of the layers of an MRAM device, such as, for example, one of the layers 18 and 22 of the device of prior art FIG. 1. Magnetic moment 104 corresponds to a stable magnetic moment opposing moment 102, and corresponds to a magnetic moment that can be interchanged (i.e., flipped) with moment 102 if an appropriate magnetic field is induced within the MRAM device. In the shown idealized construction, magnetic moments 102 and 104 are parallel with the induced magnetic field $H_x$.

FIG. 4 also illustrates a graph 110 of a detected amplitude of a property associated with the moments 102 and 104 relative to an applied field along $H_y$ during a constant applied field along $H_x$. The detected amplitude pertains to the state of an MRAM device (such as resistance through the MRAM device), and indicates if the device has a parallel or anti-parallel orientation of magnetic moments. When the field along $H_y$ reaches a sufficient magnitude, the state within the memory device will flip from anti-parallel to parallel, or vice versa, and such flip will be manifested by a change in the measured amplitude.

Graph 110 shows that the flips in the state of the memory device are occurring at induced fields of +Q and −Q. In other words, the change in state within the MRAM device occurs when magnetization along the axis $H_y$ is in a positive direction and reaches the value Q, and when magnetization along the axis $H_y$ is in a negative direction and reaches the value −Q. Graph 110 thus illustrates that the change in state within the idealized MRAM device occurs symmetrically about a zero applied field along the axis $H_y$. The change in state specifically occurs whenever an absolute value of magnetization along $H_y$ reaches the value Q.

It is noted that the orientation of a magnetic moment from one MRAM device to another within an array can be either positive or negative relative to an applied direction of $H_x$. In other words, even though two MRAM devices are adjacent one another along a common line $H_x$, and even though both have the same memory state (either parallel or anti-parallel), the net direction of the interchangeable magnetic moment can be opposite in one device relative to the other. Accordingly, both devices could have a parallel orientation, and one could have the moment 102 of FIG. 4 while the other has the moment 104 of FIG. 4. Such is not problematic in the idealized construction of FIG. 4, in that the orientation of both MRAM devices will flip at the same magnitudes of $H_x$ and $H_y$. The device which is positive relative to $H_x$ can be considered as being subjected to a positive Q value from $H_y$, and flipping due to the net effect of the combined $H_y$ and $H_x$. The device which is negative relative to $H_x$ can be considered as being subjected to a negative Q relative to $H_y$, and also flipping due to the combined net effect of $H_x$ and $H_y$.

Unfortunately, many MRAMs will not have the idealized magnetic orientation of FIG. 4, and rather will have an orientation more analogous to a non-idealized construction 120 described with reference to FIG. 5. Construction 120 comprises the orientations $H_x$ and $H_y$ of FIG. 4, but also comprises an MRAM device 122 having a magnetic moment which is canted relative to $H_x$. When the magnetic orientation of the device is flipped (e.g., changed from parallel to anti-parallel), the moment will exchange to 124. Moment 124 extends 180° relative to moment 122, and is also canted relative to $H_x$.

Figure 5:
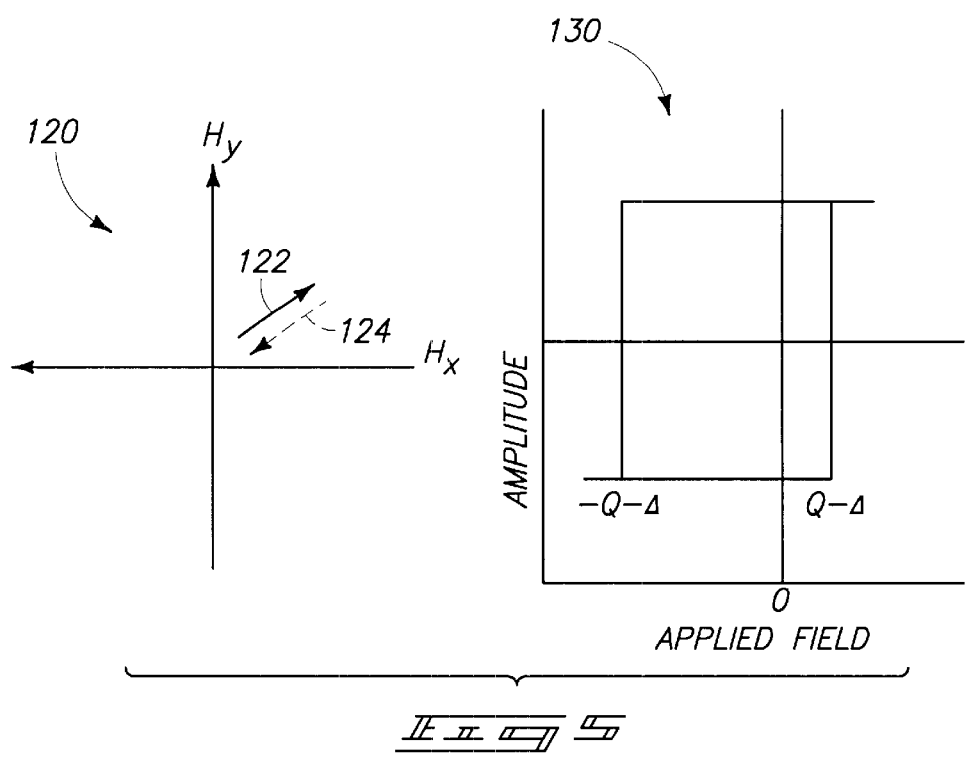
FIG. 5 illustrates diagrams of the type described above with reference to FIG. 4 for illustrating an effect of a magnetic moment orientation on the symmetry of an induced flip of the moment. The left diagram of FIG. 5 illustrates $H_y$ perpendicular to $H_x$, and shows an orientation of a moment which is not aligned along $H_x$. The right diagram of FIG. 5 illustrates an amplitude of a measured parameter associated with the moment versus an applied field along $H_y$ in the presence of a constant applied field along $H_x$.

FIG. 5 also illustrates a graph 130 having the same axis system as graph 110 in FIG. 4, and accordingly illustrating an amplitude of a physical property associated with an MRAM device as a function of a magnetic field applied along the direction $H_y$. Graph 130 assumes a static magnetic field applied along the direction $H_x$, similar to the assumption discussed above with reference to graph 110 of FIG. 4.

A difference between the graph 130 of FIG. 5 and the graph 110 of FIG. 4 is that the symmetry of the FIG. 4 graph 110 about a zero applied field does not exist in the FIG. 5 graph 130. Instead, the cant of the magnetic moment 122 relative to $H_x$ means that the magnetic moment 122 can be flipped easier along one direction of $H_y$ than along the other direction. The energy required to flip the magnetic moment is offset by a value "$\Delta$". The offset $\Delta$ can be either positive relative to Q and negative Q, or negative relative to Q and negative Q, depending on the vector direction of 122 relative to $H_x$. In the shown example, the effect of $\Delta$ is considered to be negative relative to Q and $-Q$, and accordingly has shifted the magnetic fields along $H_y$ required for a change in state of the MRAM device to $-Q-\Delta$ and $Q-\Delta$, respectively.

An effect of the principles described in FIG. 5 is that the sensitivity of an MRAM device to a magnetic field along $H_y$ varies depending on the initial interchangeable magnetic moment of the device relative to $H_y$. If the moment is positive relative to $H_y$, then the magnitude of $H_y$ which will induce a flip is reduced by $\Delta$. In contrast, if the moment is negative relative to $H_y$ then the magnitude of $H_y$ which will induce a flip is increased by $\Delta$ (specifically, the net value is $-Q-\Delta$, or in other words, the absolute value has increased to $Q+\Delta$).

The canting of a magnetic moment described with reference to FIG. 5 can account for the problematic variation in operating parameters amongst various MRAM devices of an array, and can be considered a switching asymmetry. The canting of magnetic moments in MRAM devices relative to field $H_x$ can result from numerous causes, including bit shape, offset fields, interactions between neighboring bits, chemical and/or structural variations within the magnetic layers of the devices, and misalignments between the conductive lines utilized for $H_x$ and $H_y$ and the MRAM devices formed between the lines.

The mechanisms described above with reference to FIGS. 4 and 5 are provided herein to assist the reader in understanding various aspects of the present invention. The claims of this disclosure are not to be interpreted as being limited to the particular mechanism described herein, except to the extent, if any, that such mechanism is expressly incorporated into the claims. Further, to the extent that the mechanism should later prove to be erroneous, the invention is still considered to be fully enabled by the disclosure provided herein.

Figure 6:
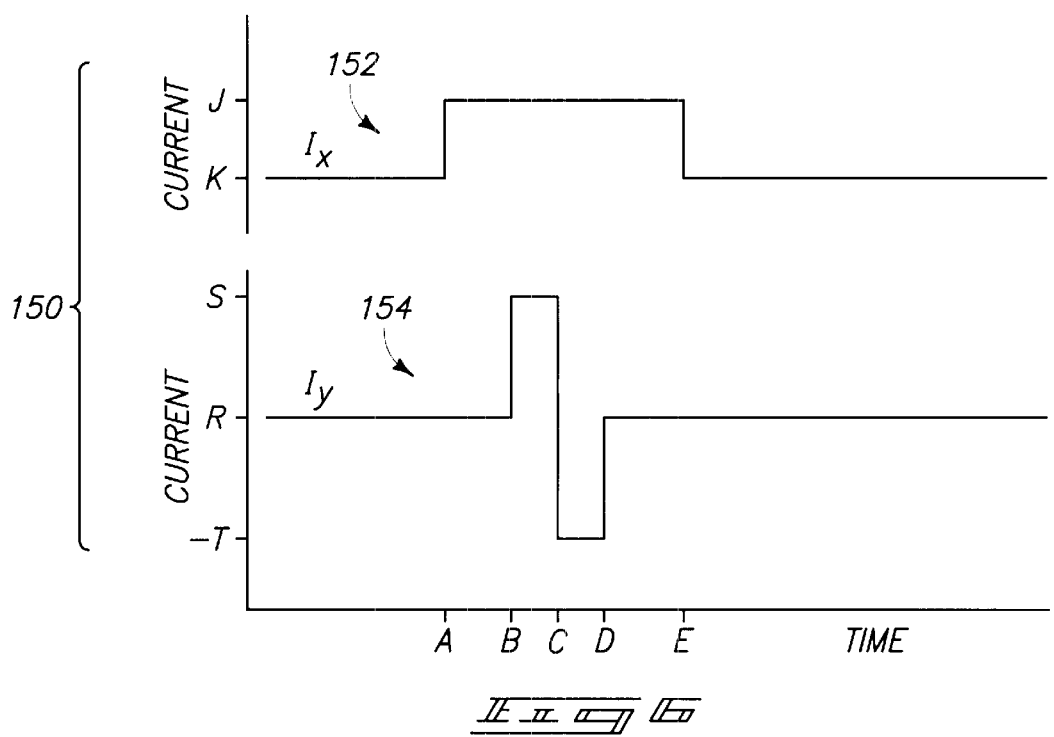
FIG. 6 illustrates a graph of current versus time along $I_x$ stacked over a graph of current versus time along $I_y$ to show a pulse pattern which can be utilized in an aspect of the present invention.

FIG. 6 illustrates an aspect of the present invention for overcoming the variation in magnetic field sensitivity that can be encountered amongst various MRAM devices of a array. Specifically, FIG. 6 comprises a graphical illustration 150 of current pulses along the lines $I_x$ and $I_y$ of an MRAM device (such as the device of FIG. 1, with the lines $I_x$ and $I_y$ corresponding to lines 24 and 16). Illustration 150 comprises a graph 152 showing the current pulse along $I_x$ as a function of time, and a graph 154 showing a current pulse along $I_y$ as a function of time. Graphs 152 and 154 both share a common time axis.

The graphs of FIG. 6 illustrate that the current along $I_x$ starts at an initial base level K, and at time A the current is increased to a second level J. Level J can be, for example, at least 0.1 milliamp above level K, and in exemplary applications will be from about 0.1 milliamp to about 100 milliamps above level K. Such can induce a field $H_x$ within an MRAM device of from about 10 Oersteds to about 200 Oersteds.

After the current along $I_x$ is increased to value J, and at a time B, a current along $H_y$ is increased from a base value R to a new value S. The difference between S and R can be, for example, at least about 0.1 milliamp, and would typically be from about 0.1 milliamp to about 100 milliamps. The current along $I_y$ at value S can induce a magnetic field ($H_y$) within an MRAM device having an absolute value of at least about 10 Oersteds, or at least about 30 Oersteds, in particular applications having an absolute value within arrange of from about 10 Oersteds to about 200 Oersteds, and in further applications having an absolute value of from about 10 Oersteds to about 100 Oersteds.

The difference between S and R can be identical to the difference between J and K, and the magnetic field induced by $I_y$ at value S can be identical to the field induced by $I_x$ at value J. Accordingly, both $I_y$ at value J and $I_x$ at value S can induce magnetic fields having absolute values of about 10 Oersteds, and in particular applications can induce magnetic fields having absolute values in a range of from about 10 Oersteds to about 100 Oersteds.

The current along $I_y$ is maintained at value S until time C, at which point the current is reversed along $I_y$ and brought to a new value $-T$. The absolute difference between R and $-T$ can be identical to the absolute difference between S and R, and accordingly $I_y$ at value $-T$ can induce a field $H_y$ with an absolute magnitude of at least 10 Oersteds, at least 30 Oersteds, and in particular applications within a range of from 10 Oersteds to 200 Oersteds, or within a range of from 10 Oersteds to 100 Oersteds.

The current along $I_y$ is maintained at value $-T$ until time D, whereupon it returns to base value R. At a subsequent time E, the current along $I_x$ is returned to base value K.

The time between B and C can be at least about 2 nanoseconds, and can be in a range of from about 2 nanoseconds to about 100 nanoseconds. Similarly, the time between C and D can be at least about 2 nanoseconds, and in particular applications can be from at least about 2 nanoseconds to about 100 nanoseconds. Further, the time between C and D can be substantially identical to the time between B and C, with the term "substantially" identical indicating that the times are identical within error of measurement.

The pulse along $I_y$ occurring at time B can be considered a first pulse, and the pulse occurring at time C can be considered a second pulse sequential to the first pulse. The time of the first pulse can be considered to extend between times B and C, and the time of the second pulse can be considered to extend between times C and D. A total time of the combined sequential pulses can be from at least about 4 nanoseconds to about 200 nanoseconds. It is noted that the pulses are shown occurring as delta functions in the idealized graphs of FIG. 6, but it is to be understood that there would typically be some lag during the change in current between R and S, as well as during the change between S and −T, and accordingly the transitions shown at times B, C and D would typically have a measurable slope. Similarly, the transitions shown at times A and E for the current along $I_x$ would typically also have a measurable slope.

The time between the end of the last pulse along $I_y$ (time D) and the end of the pulse along $I_x$ (time E) is typically at least 10% longer than a combined time of all the pulses along $I_y$ (the difference between D and B in the shown aspect of the invention), and can, for example, be anywhere from a time that is 1% longer than the combined time of all sequential pulses along $I_y$ to about 1,000% longer than the combined time of all of the sequential pulses along $I_y$.

The pulses along $I_y$ can be considered to induce two opposing orientations of $H_y$ within an MRAM device, and can be considered as bipolar or bi-directional pulses. The first pulse extending between times B and C, and corresponding to the upper portion of the shown graph of current along $I_y$, can be considered to induce a positive orientation of magnetic field $H_y$ within an MRAM device; and the pulse extending between C and D, and corresponding to the negative current −T in the shown graph of current along the line $I_y$, can be considered to induce a negative magnetic field $H_y$ within the MRAM device.

The description of FIG. 6 shows that $H_x$ is stable and substantially constant during the inducing of the two opposing orientations of $H_y$.

Although $I_x$ (and accordingly $H_x$) is held constant while a variation occurs along $I_y$ (and accordingly $H_y$), it is to be understood that the invention can also be practiced by maintaining a constant magnetic field $H_y$ while inducing changes in magnetic field $H_x$. In such applications, it can still be desired that the current along $I_x$ be outside of a base level (either above or below the base level) after the current along $I_y$ is returned to the base level in order to ensure that an influenced magnetic moment is fully transferred to a stable state.

The shown pulses of FIG. 6 would typically be applied along the orthogonal lines 16 and 24 of FIG. 1. Accordingly, if line 24 was utilized for inducing $H_x$ and line 16 was utilized for inducing $H_y$, then a pulse of current would be passed along the line 24 while passing at least two sequential pulses of current along line 16. The pulses passed along line 16 would comprise one pulse that went along the first direction of the line, and a second pulse which went in an opposite direction to the first pulse. Accordingly, $H_y$ would be induced to extend in a first direction (for purposes of the present example, assume that the first direction is outwardly of the page), and then would be induced to extend in a second direction opposite to the first direction (for purposes of the present example, the second direction would be inward to the page).

Another description of an aspect of the invention is that current can be considered as flowing along a first axis within line 16 (the first axis can be, for example, left along the line), and such can be considered to induce a first magnetic field within MRAM device 12. Also, current can be considered to be flowing along line 24 in a second axis, substantially orthogonal to the first axis, and such can be considered to induce a second magnetic field within MRAM device 12. While the second magnetic field is within the MRAM device, the current flow along the axis of line 16 can be reversed to induce a third magnetic field within device 12 which is opposite in orientation to the first magnetic field which had been induced within the device.

The various fields introduced into device 12 can be utilized during an operation of writing information to the device, and/or during operation of reading information from the device.

It is noted that although the application of FIG. 6 has the current increase along $I_x$ prior to the increase along $I_y$, in other applications of the invention (not shown) the current along $I_y$ can be increased prior to the increase along $I_x$.

Figure 7:
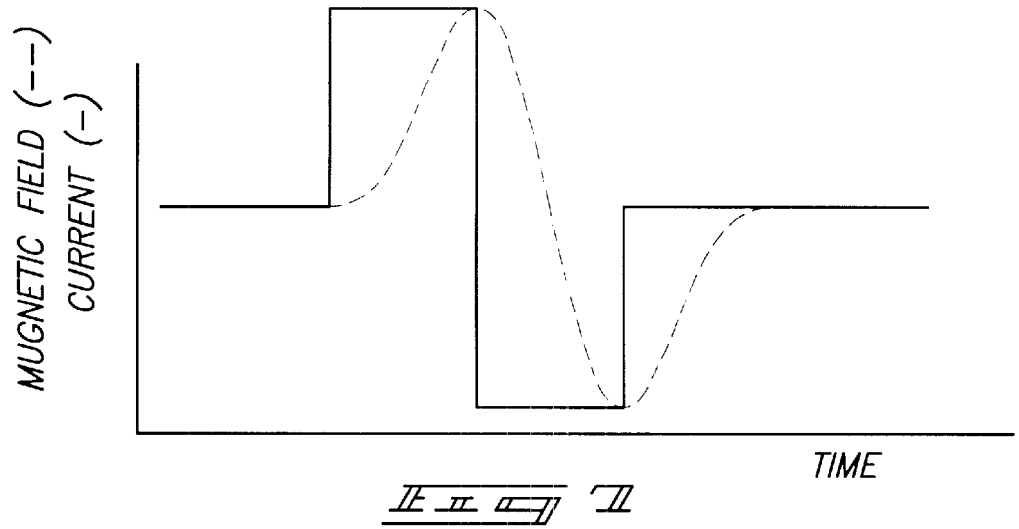
FIG. 7 illustrates a graph of current versus time along either $I_x$ or $I_y$, and further illustrates a magnetic field induced within an MRAM device by the flow of current.
Figure 8:
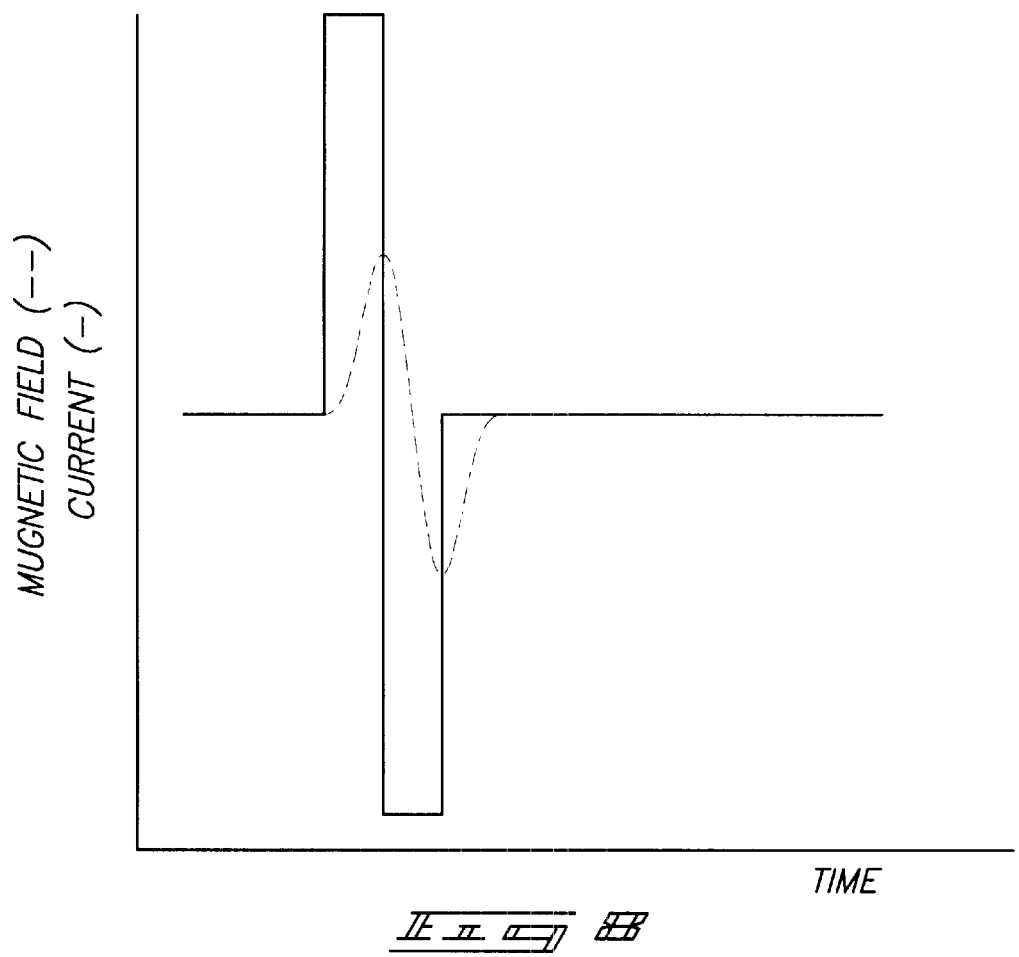
FIG. 8 illustrates a graph of current versus time along either $I_x$ or $I_y$, and further illustrates a magnetic field induced within an MRAM device by the flow of current.

FIGS. 7 and 8 illustrate an effect of the duration of pulses along a conductive line (either $I_x$ or $I_y$) on the induced magnetic field achieved by the current. Specifically, FIG. 7 illustrates that if a current is pulsed for relatively long periods (with the current shown as a solid line), then an induced magnetic field (shown as a dashed line) will reach a maximum level. Accordingly, if it is desired to form a magnetic field of, for example, 40 Oersteds, then a suitable current for achieving a maximum induced field of 40 Oersteds can be flowed through the conductive line with pulses having sufficient duration to allow the magnetic field to reach the maximum. In contrast, FIG. 8 illustrates that short pulses along a conductive line will typically not be sufficient to allow the magnetic field to reach its maximum achievable value, due to a delay between the time that current is flowed and the time that a magnetic field is achieved. Accordingly, if an induced field of 40 Oersteds is desired, and rapid pulsing is also desired, then the current chosen for the pulse should be a larger current than that utilized in FIG. 7 so that the 40 Oersted pulse is achieved even though the maximum magnetic field that could be induced by the current is not induced due to the short duration of the pulse.

FIGS. 7 and 8 illustrate that a rapid operating time (FIG. 8) can be achieved in MRAM devices at the expense of additional power utilized to cycle high currents through the conductive lines inducing magnetic fields in the devices.

FIG. 9 contains a graphical illustration 200 showing additional aspects of the invention. Specifically, illustration 200 shows a graph 202 of current $I_x$ along the conductive line utilized for generating $H_x$ and a graph 204 of current $I_y$ along the conductive line utilized for inducing $H_y$. The graphs 202 and 204 are shown relative to a common time axis.

The graphs 202 and 204 show multiple positive and negative pulses occurring along $I_y$ simultaneously with a pulse along $I_x$, and shows that the positive and negative pulses can vary in duration and absolute magnitude relative to one another. Further, graph 204 illustrates that there can be delays (such as; for example, a delay 206) occurring between various of the pulses.

It is noted that utilization of fields $H_x$ and $H_y$ can be reversed relative to the aspect shown in FIG. 9. Accordingly, the multiple pulses could occur along the line utilized for inducing $H_x$, and the stable pulse could be utilized along the line which induces $H_y$.

FIG. 10 contains a graphical illustration 300 showing additional aspects of the invention. Specifically, illustration 300 shows a graph 302 of current $I_x$ along the conductive line utilized for generating $H_x$ and a graph 304 of current $I_y$ along the conductive line utilized for inducing $H_y$. The graphs 302 and 304 are shown relative to a common time axis.

The graph 302 of $I_x$ shows positive and negative pulses occurring, and the graph 304 of $I_y$ also shows positive and negative pulses occurring. Accordingly, $H_x$ is induced along two opposing orientations during the inducing of the two opposing orientations of $H_y$. The pulses along $I_x$ start before the pulses along $I_y$, and last after the current along $I_y$ is returned to a base level. As discussed previously, it is desired to induce $H_x$ for a period longer than $H_y$ to ensure that a magnetic moment of an MRAM device is flipped to a stable state.

The methodology of the present invention can enable MRAM bits to be switched along a path of lowest energy, even when switch asymmetry exists in an MRAM array. In particular aspects, the invention can be considered to encompass provision of a direct current (DC) bias along two opposing directions of a conductive line to induce two opposing magnetic fields in an MRAM device during writing to and/or reading from the MRAM device.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of operating a half-select MRAM construction, comprising sequentially inducing two opposing orientations of $H_y$ within an MRAM device while inducing $H_x$ within the device.

2. The method of claim 1 wherein the induced $H_x$ is stable and substantially constant during the inducing of the two opposing orientations of $H_y$.

3. The method of claim 1 wherein the induced $H_x$ is induced along two opposing orientations during the inducing of the two opposing orientations of $H_y$.

4. The method of claim 1 wherein the opposing $H_y$ orientations each comprise an absolute magnitude, and wherein the absolute magnitudes of the opposing $H_y$ orientations are substantially equal to one another.

5. The method of claim 1 wherein the opposing $H_y$ orientations each comprise an absolute magnitude, and wherein the absolute magnitudes of the opposing $H_y$ orientations are substantially equal to one another and within a range of from about 10 Oersteds to about 200 Oersteds.

6. The method of claim 1 wherein each of the $H_y$ orientations is induced for at least about 2 nanoseconds, and wherein $H_x$ is induced for at least about 10% longer than a combined time of each of the $H_y$ orientations.

7. The method of claim 1 wherein the opposing orientations of $H_y$ have absolute values of at least about 10 Oersteds.

8. The method of claim 1 wherein the opposing orientations of $H_y$ have absolute values of at least about 10 Oersteds; and wherein $H_x$ has an absolute value of at least about 10 Oersteds.

9. The method of claim 1 wherein the opposing orientations of $H_y$ have absolute values of at least about 30 Oersteds.

10. The method of claim 1 wherein the opposing orientations of $H_y$ have absolute values in a range of from 10 Oersteds to 200 Oersteds.

11. The method of claim 1 wherein the opposing orientations of $H_y$ have absolute values in a range of from 10 Oersteds to 100 Oersteds.

12. The method of claim 1 wherein the opposing orientations of $H_y$ have absolute values in a range of from 10 Oersteds to 100 Oersteds; and wherein $H_x$ has an absolute value in a range of from 10 Oersteds to 100 Oersteds.

13. A method of operating a half-select MRAM construction, comprising sequentially inducing two opposing orientations of $H_x$ within an MRAM device while inducing $H_y$ within the device.

14. The method of claim 13 wherein the opposing $H_x$ orientations each comprise an absolute magnitude, and wherein the absolute magnitudes of the opposing $H_x$ orientations are substantially equal to one another.

15. The method of claim 13 wherein the opposing $H_x$ orientations each comprise an absolute magnitude, and wherein the absolute magnitudes of the opposing $H_x$ orientations are substantially equal to one another and within a range of from about 10 Oersteds to about 200 Oersteds.

16. The method of claim 13 wherein each of the $H_x$ orientations is induced for at least about 2 nanoseconds, and wherein $H_y$ is induced for at least about 10% longer than a combined time of each of the $H_x$ orientations.

17. The method of claim 13 wherein the opposing orientations of $H_x$ have absolute values in a range of from 10 Oersteds to 100 Oersteds; and wherein $H_y$ has an absolute value in a range of from 10 Oersteds to 100 Oersteds.

18. A method of operating an MRAM construction, the MRAM construction including a MRAM device between a pair of substantially orthogonal conductive lines, one of the substantially orthogonal conductive lines being configured to induce $H_y$ within the device when current passes through said one of the lines, and the other of the substantially orthogonal conductive lines being configured to induce $H_x$ within the device when current passes through said other of the lines, the method comprising passing a first pulse of current along a first of the two conductive lines while passing at least two sequential pulses of current along a second of the two conductive lines; the at least two sequential pulses including a pulse along a first direction of the second of the two conductive lines, and a pulse along a second direction opposite to the first direction.

19. The method of claim 18 wherein the at least two sequential pulses are exactly two sequential pulses.

20. The method of claim 18 wherein the at least two sequential pulses comprise at least four sequential pulses.

21. The method of claim 18 wherein the first of the two conductive lines corresponds to the conductive line configured to induce $H_y$.

22. The method of claim 18 wherein the first of the two conductive lines corresponds to the conductive line configured to induce $H_x$.

23. The method of claim 18 wherein each of the sequential pulses has an absolute maximum magnitude of current of at least about 0.1 milliamp.

24. The method of claim 18 wherein each of the sequential pulses has an absolute maximum magnitude of current of from about 0.1 milliamp to about 100 milliamps.

25. The method of claim 18 wherein each of the sequential pulses has an absolute maximum magnitude of current, and where in the absolute magnitudes of the sequential pulses are substantially equal to one another.

26. The method of claim 18 wherein the first pulse lasts for a time that is at least about 10% longer than the combined time of the sequential pulses.

27. The method of claim 18 wherein the first pulse lasts for a time that is from about 1% to about 1000% longer than the combined time of the sequential pulses.

28. The method of claim 18 wherein the first pulse lasts for a time that is from about 10% to about 1000% longer than the combined time of the sequential pulses.

29. The method of claim 18 wherein the sequential pulses last for a combined time of at least about 4 nanoseconds, and wherein the first pulse lasts for a time that is at least 10% longer than the combined time of the sequential pulses.

30. The method of claim 18 wherein the sequential pulses last for a combined time of at least about 4 nanoseconds.

31. The method of claim 18 wherein the sequential pulses last for a combined time of from at least about 4 nanoseconds to about 200 nanoseconds.

32. The method of claim 18 wherein each of the sequential pulses lasts for a time of from at least about 2 nanoseconds to about 100 nanoseconds.

33. The method of claim 18 wherein each of the sequential pulses lasts for a time period; and wherein the time periods of the sequential pulses are substantially equal to one another.

34. A method of operating an MRAM construction, the MRAM construction including a MRAM device between a pair of substantially orthogonal conductive lines, one of the substantially orthogonal conductive lines being configured to induce $H_y$ within the device when current passes through said one of the lines, and the other of the substantially orthogonal conductive lines being configured to induce $H_x$ within the device when current passes through said other of the lines, the method comprising passing at least two sequential pulses of current along a first of the two conductive lines while passing at least two sequential pulses of current along a second of the two conductive lines; the at least two sequential pulses along the first of the conductive lines including a pulse along a first direction of the first of the two conductive lines, and a pulse along a second direction of the first of the two conductive lines opposite to the first direction of the first of the two conductive lines; the at least two sequential pulses along the second of the conductive lines including a pulse along a first direction of the second of the two conductive lines, and a pulse along a second direction of the second of the two conductive lines opposite to the first direction of the second of the two conductive lines.

35. The method of claim 34 wherein the pulses which induce $H_x$ continue for a longer period of time than the pulses which induce $H_y$.

36. A method of operating an MRAM device, comprising:
flowing current in a defined forward direction along a first axis relative to the device to induce a first magnetic field within the device;
while the first magnetic field is within the device, flowing current along a second axis relative to the device to induce a second magnetic field within the device; the second axis being different than the first axis; and
while the second magnetic field is within the device, reversing the current flow along the first axis to a defined reverse direction and inducing a third magnetic field within the device while the current flows along first axis in the reverse direction.

37. The method of claim 36 wherein the second axis is substantially orthogonal to the first axis.

38. The method of claim 36 wherein the first, second and third magnetic fields are induced during an operation of writing information to the MRAM device.

39. The method of claim 36 wherein the first, second and third magnetic fields are induced during an operation of reading information from the MRAM device.

40. The method of claim 36 wherein the current flow along the first axis has an absolute maximum magnitude of at least about 0.1 milliamp during inducement of both the first and second magnetic fields.

41. The method of claim 36 wherein the current flow along the first axis has an absolute maximum magnitude of from about 0.1 milliamp to about 100 milliamps during inducement of both the first and second magnetic fields.

42. The method of claim 36 the current flow along the first axis has a first absolute maximum magnitude during inducement of the first magnetic field and a second absolute maximum magnitude during inducement of the second magnetic field, and wherein the first and second absolute magnitudes are substantially equal to one another.

43. The method of claim 36 wherein the current flow along the second axis lasts for a time that is at least about 10% longer than the combined time of the forward and reverse direction current flows along the first axis.

44. The method of claim 36 wherein the current flow along the second axis lasts for a time that is from about 1% to about 1000% longer than the combined time of the forward and reverse direction current flows along the first axis.

45. The method of claim 36 wherein the current flow along the second axis lasts for a time that is from about 10% to about 1000% longer than the combined time of the forward and reverse direction current flows along the first axis.

46. The method of claim 36 wherein the forward and reverse direction current flows along the first axis last for a combined time of at least about 4 nanoseconds.

47. The method of claim 36 wherein the forward and reverse direction current flows along the first axis last for a combined time of from at least about 4 nanoseconds to about 200 nanoseconds.

48. The method of claim 36 wherein each of the forward and reverse direction current flows along the first axis lasts for a time period; and wherein the time period of the forward direction current flow is substantially equal to the time period of the forward direction current flow.

49. The method of claim 36 wherein the first and third magnetic fields each comprise an absolute magnitude, and wherein the absolute magnitudes of the first and third magnetic fields are substantially equal to one another.

50. The method of claim 36 wherein the first and third magnetic fields each comprise an absolute magnitude, and wherein the absolute magnitudes of the first and third magnetic fields are substantially equal to one another and within a range of from about 10 Oersteds to about 200 Oersteds.

51. The method of claim 36 wherein the first and third magnetic fields have absolute values of at least about 10 Oersteds.

52. The method of claim 36 wherein the first and third magnetic fields have absolute values of at least about 10 Oersteds; and wherein the second magnetic field has an absolute value of at least about 10 Oersteds.

53. The method of claim 36 wherein the first and third magnetic fields have absolute values of at least about 30 Oersteds.

54. The method of claim 36 wherein the first and third magnetic fields have absolute values in a range of from 10 Oersteds to 200 Oersteds.

55. The method of claim 36 wherein the first and third magnetic fields have absolute values in a range of from 10 Oersteds to 100 Oersteds.

56. The method of claim 36 wherein the first and third magnetic fields have absolute values in a range of from 10 Oersteds to 100 Oersteds; and wherein the second magnetic field has an absolute value in a range of from 10 Oersteds to 100 Oersteds.

* * * * *

UNITED STATES PATENT AND TRADEMARK OFFICE
CERTIFICATE OF CORRECTION

PATENT NO. : 6,683,806 B2
DATED : January 27, 2004
INVENTOR(S) : Joel A. Drewes

It is certified that error appears in the above-identified patent and that said Letters Patent is hereby corrected as shown below:

<u>Column 8,</u>
Line 36, replace "applications having an absolute value within arrange of from" with -- applications having an absolute value within a range of from --

<u>Column 14,</u>
Line 7, replace "The method of claim 36 the current flow along the first" with -- The method of claim 36 wherein the current flow along the first --
Line 36, replace "period of the forward direction current flow" with -- period of the reverse direction current flow --

Signed and Sealed this

Seventh Day of September, 2004

JON W. DUDAS
*Director of the United States Patent and Trademark Office*